United States Patent
Ramanan et al.

(10) Patent No.: US 10,984,846 B2
(45) Date of Patent: Apr. 20, 2021

(54) REFERENCE GENERATION FOR VOLTAGE SENSING IN A RESISTIVE MEMORY

(71) Applicant: NXP USA, Inc., Austin, TX (US)

(72) Inventors: Karthik Ramanan, Austin, TX (US); Jon Scott Choy, Austin, TX (US); Jacob Williams, Austin, TX (US)

(73) Assignee: NXP USA, Inc., Austin, TX (US)

( * ) Notice: Subject to any disclaimer, the term of this patent is extended or adjusted under 35 U.S.C. 154(b) by 8 days.

(21) Appl. No.: 16/507,691

(22) Filed: Jul. 10, 2019

(65) Prior Publication Data
US 2021/0012821 A1    Jan. 14, 2021

(51) Int. Cl.
*G11C 11/16* (2006.01)

(52) U.S. Cl.
CPC ...... *G11C 11/1673* (2013.01); *G11C 11/1697* (2013.01)

(58) Field of Classification Search
CPC .................. G11C 11/1673; G11C 11/1697
USPC ................... 365/158, 154, 207, 205
See application file for complete search history.

(56) References Cited

U.S. PATENT DOCUMENTS

| 850,900 | A | 4/1907 | Boyton |
| 6,693,826 | B1 | 2/2004 | Black, Jr. et al. |
| 8,587,994 | B2 | 11/2013 | Kim et al. |
| 9,251,881 | B2 | 2/2016 | Kim et al. |
| 9,502,088 | B2 | 11/2016 | Jung et al. |
| 9,659,622 | B1* | 5/2017 | Choy .................. G11C 11/1659 |
| 10,224,088 | B1* | 3/2019 | Choy .................. G11C 11/1673 |
| 2011/0069554 | A1* | 3/2011 | Lo Giudice ............ G11C 16/28 365/185.21 |
| 2013/0265820 | A1 | 10/2013 | Chih et al. |
| 2014/0241091 | A1* | 8/2014 | Choy ....................... G11C 5/14 365/207 |
| 2014/0269030 | A1 | 9/2014 | Chih et al. |

OTHER PUBLICATIONS

Na et al.: "Reference-Scheme Study and Novel Reference Scheme for Deep Submicrometer STT-RAM", IEEE Transactions on Circuits and Systems—I: Regular Papers, vol. 61, No. 12, Dec. 2014, pp. 3376-3385.

* cited by examiner

*Primary Examiner* — Connie C Yoha

(57) ABSTRACT

A sense amplifier circuit includes a reference path, a cell path, and a comparator circuit. The reference path includes a first current load device and a reference comparison node in which the reference path is coupled to a cell reference circuit during a read, wherein the first current load device includes a control input for controlling a current of the reference path. The cell path includes a second current load device and a cell comparison node in which the cell path is coupled to a memory cell during a read, wherein the second current load device includes a control input for controlling a current of the cell path. The comparator circuit indicates a data value being stored in the memory cell based on a comparison of voltages at the reference and cell comparison nodes. Different signals are provided to the control inputs of the first and second current load devices.

20 Claims, 3 Drawing Sheets

REFERENCE GENERATION FOR VOLTAGE SENSING IN A RESISTIVE MEMORY

BACKGROUND

Field

This disclosure relates generally to memories, and more specifically, to generating a reference voltage for a resistive memory.

Related Art

Resistive memories, such as Magneto-resistive Random Access Memories (MRAMs), are commonly used as non-volatile memories (NVMs). The magnetic element of an MRAM cell is the Magnetic Tunnel Junction (MTJ). For example, when the magnetic moments of the interacting magnetic layers of the MTJ are aligned, a low resistance state (LRS) is stored, corresponding to a "0", and conversely, when the moments are misaligned, a high resistance is stored (HRS), corresponding to a "1". Reading data stored in such memories is accomplished by sensing differences in resistance in a resistive element of a memory cell between the LRS and HRS two states. However, the difference in resistance between a high state and a low state can be very small. This is further exacerbated at high temperatures where the difference in resistance is even less. Due to the small resistance deltas that must be sensed, proper reference generation is critical to enable successful sensing. Various sources of error need to be accounted for during sensing. Therefore, a need exists for improved sensing in a resistive memory, even across variations in temperature.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Due to the increasingly smaller delta in resistance between two resistive states of a resistive memory, such as an MRAM, bias generation circuits are used which improve sensing margin. In an MRAM, a reference poly resistor, having a resistance between the LRS and HRS, is typically used to generate voltage references to be compared with the data in the memory element (e.g. MTJ) of the memory cell. However, this poly has a large process variation and a temperature coefficient that is very different from that of the memory element (e.g. MTJ) of the memory cell. Therefore, a sensing scheme is used in the MRAM which reduces or cancels the effects of the poly resistor. In one aspect, for sensing of an MRAM bit cell, a first bias voltage is generated to produce a constant current through the MTJ of the bit cell being sensed, regardless of the resistive state of the MTJ, and a second bias voltage is generated that produces a constant voltage drop over the corresponding reference poly resistor which compensates for temperature and process variations of the reference poly resistor. In this manner, an improved reference voltage can be generated based on the reference poly resistor, for use by the sense amplifier, to compare with the sensed voltage of the MTJ. This results in an improved sensing schemed, even across process and temperature variations.

Figure 1:
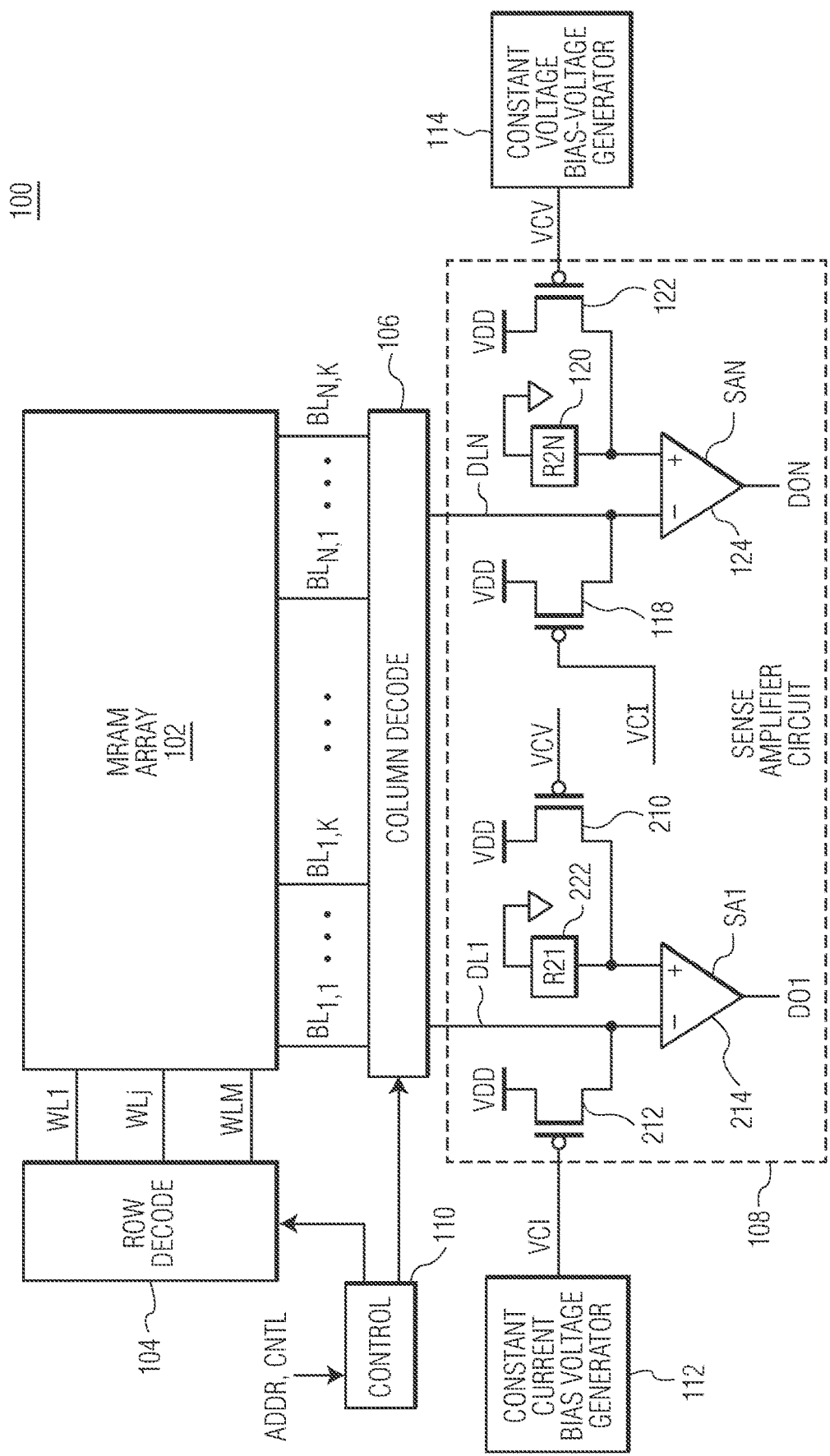
FIG. 1 illustrates, in partial schematic and partial block diagram form, an MRAM in accordance with one embodiment of the present invention.

FIG. 1 illustrates, in partial schematic and partial block diagram form, an MRAM 100 in accordance with one embodiment of the present invention. MRAM 100 includes an MRAM array 102, a row decoder 104, a column decoder 106, control circuitry 110, a sense amplifier circuit 108, a constant current bias voltage generator 112 and a constant voltage bias voltage generator 114. MRAM array 102 includes M rows, each having a corresponding word line, WL1-WLM, and N*K columns, each having a corresponding bit line (BL). (Note that WLj simply refers to a selected word line which will be used in the more detailed view of FIG. 2.) The bit lines are grouped into N groups of K bit lines, resulting in $BL_{1,1}$-$BL_{1,K}$ through $BL_{N,1}$-$BL_{N,K}$, in which each BL is followed by two indices, the first index indicating the group and the second index indicating the one of K bit lines within group. A bit cell of MRAM array 102 is located at each intersection of a word line and a bit line. Row decode 104 is coupled to the word lines and column decode 106 is coupled between the bit lines and sense amplifier circuit 108. Control circuitry 110 receives an access address (ADDR) and corresponding control signals (CNTL) and is coupled to both row decode 104 and column decode 106. Sense amplifier circuit 108 is coupled to N data lines, DL1-DLN, of column decode 106 and includes N sense amplifiers (SAs) which output N data outputs, DO1-DON. Constant current bias voltage generator 112 provides a first global bias voltage, VCI, to sense amplifier circuit 108. Constant voltage bias voltage generator 114 provides a second global bias voltage, VCV, to sense amplifier circuit 108. Note that MRAM 100 of FIG. 1 is a simplified MRAM, having the elements needed to describe embodiments of the present invention, and may therefore include further elements and aspects not illustrated and not pertinent to the embodiments described herein. For example, MRAM array 102 also includes a source line for each column (corresponding to each bit line) which may also be coupled to column decode 106. The source lines, like the bit lines, are coupled to the bit cells of MRAM array 102.

In operation, in response to an access address for a read or write operation, row decode 104 activates one word line, based on a first portion of the access address, and column decode 106 selects one bit line from each of the N groups of bit lines to couple to a corresponding data line, DL1-DLN, based on a second portion of the access address. In this manner, a particular row of bit cells of array 102, located at the intersections of the selected word line and the selected bit lines, is accessed for a read/write operation. For a read operation, the data lines are sensed by sense amplifier circuit 108 to produce the corresponding output data DO1-DON. For a write operation, write circuitry (not shown) provides write data to DL1-DLN to be stored in the selected bit cells. Control circuitry 110 parses the access address and provides the appropriate first portion to row decode 104 and column decode 106, and provides timing information and any other control signals, as necessary and as known in the art, for performing reads and writes of array 102.

Sense amplifier circuit 108, used in sensing the selected bit lines for a read operation, includes N SAs. Each SA has a first input coupled to a corresponding DL of DL1-DLN, as well as a corresponding current load device, and a second input coupled to a first terminal of a corresponding reference poly resistor, R2, of R21-R2N, as well as a corresponding current load device. In the illustrated embodiment, each current load device is implemented as a p-type metal-oxide-semiconductor (PMOS) transistor having a first current electrode coupled to a first voltage supply terminal, e.g., VDD, a control electrode coupled to receive a global bias voltage (e.g. VCI or VCV), and a second current electrode coupled to the first or second input of the corresponding SA. In one embodiment, each SA is implemented as a comparator and the first input of each SA corresponds to the inverting input of the comparator and the second input to the non-inverting input of the comparator. Alternatively, though, the inverting and non-inverting inputs may be swapped.

Referring to SA1 214 in sense amplifier circuit 108, the corresponding DL, DL1, is coupled to the inverting input of SA1 214. A first current electrode of a PMOS transistor 212 (also referred to as the current load device or a current source) is coupled to VDD, a control electrode of PMOS transistor 212 is coupled to receive VCI, and a second current electrode of PMOS transistor 212 is also coupled to the inverting input of SA1 214. A first terminal of reference poly resistor R21 222 is coupled to the non-inverting input of SA1 214, and a second terminal of R21 222 is coupled to a second supply voltage terminal, e.g. VSS. A first current electrode of a PMOS transistor 210 (also referred to as the current load device or a current source) is coupled to VDD, a control electrode of PMOS transistor 210 is coupled to receive VCV, and a second current electrode of PMOS transistor 210 is also coupled to the non-inverting input of SA1 214. SA1, based on its inputs, outputs DO1. Note that analogous connections apply to PMOS transistors 118 and 122, reference poly resistor R2N, and SAN, which all correspond to DLN and DON. Analogous elements and connections would apply for each SA in sense amplifier circuit 108.

Figure 2:
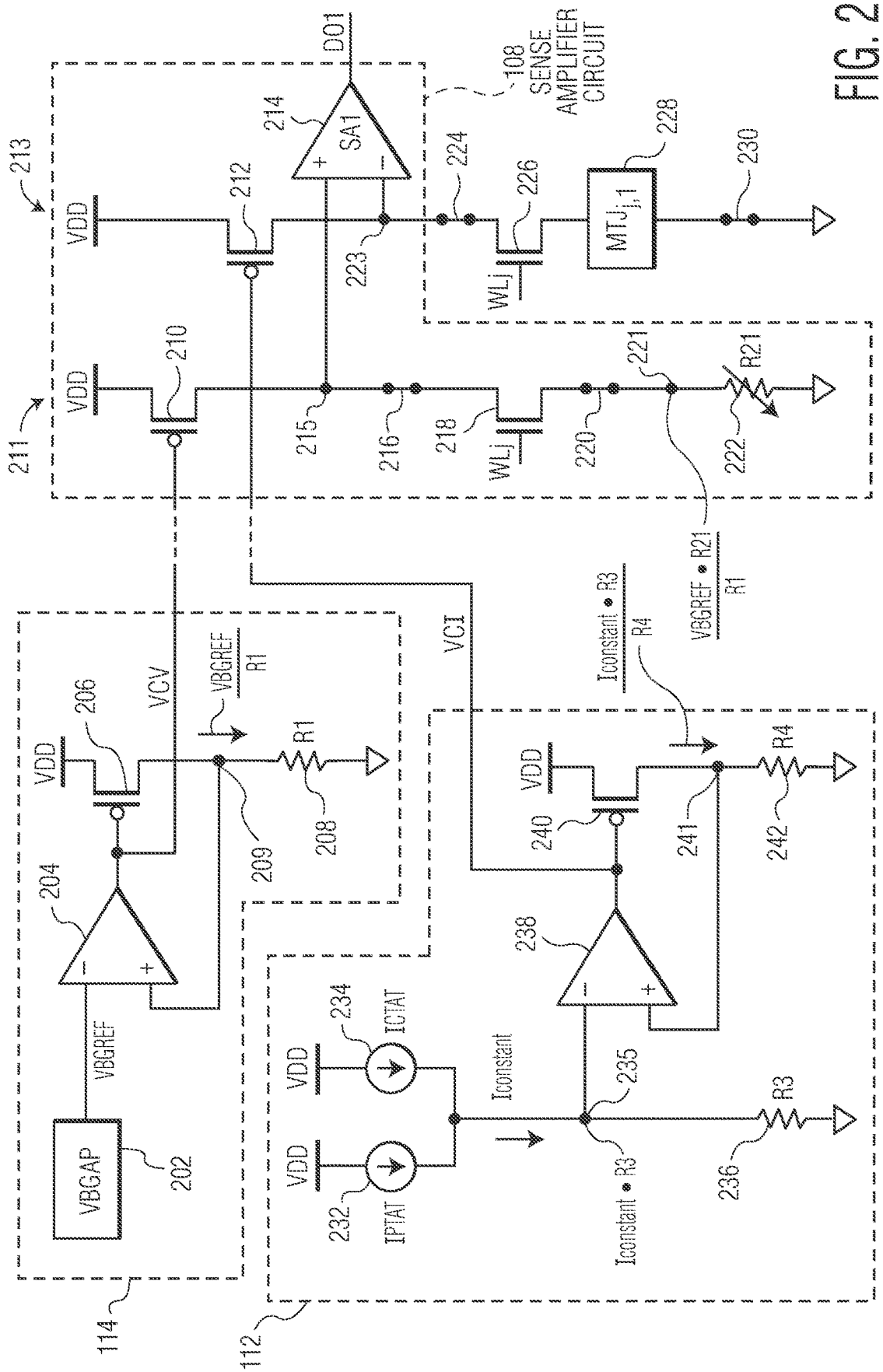
FIG. 2 illustrates, in partial block diagram and partial schematic form, a portion of the MRAM of FIG. 1, in accordance with one embodiment of the present invention.

Note that the input of a sense amplifier coupled to the corresponding R2 may be referred to as the reference path of the sense amplifier and the input coupled to the corresponding DL may be referred to as the cell path of the sense amplifier, as will be seen in more detail in reference to FIG. 2. VCI and VCV are considered global bias voltages because they are each provided to multiple currents sources for use by each of SA1-SAN, as opposed to being provided for use by only one SA.

FIG. 2 illustrates, in partial block diagram form and partial schematic form, further details of bias generators 112 and 114, as well as a portion of sense amplifier circuit 108 corresponding to SA1 214, and an example bit cell, including a pass transistor 226 and a memory element (e.g. MTJ) 228, selected for sensing which is coupled to WLj of MRAM array 102. Bias voltage generator 114 includes a bandgap voltage generator 202 which provides a bandgap voltage reference, VBGREF, an amplifier 204, a PMOS transistor 206, and a poly resistor R1 208. An inverting input of amplifier 204 is coupled to receive VBGREF, and an output of amplifier 204 provides VCV and is coupled to a control electrode of transistor 206. A first current electrode of transistor 206 is coupled to VDD and a second current electrode of transistor 206 is coupled to a circuit node 209. A non-inverting input of amplifier 204 is coupled to node 209. A first terminal of R1 208 is coupled to node 209, and a second terminal of R1 208 is coupled to VSS.

Bias voltage generator 112 includes a current source 232 coupled between VDD and a circuit node 235 which generates a current proportional to temperature (IPTAT), a current source 234 coupled between VDD and node 235 which generates a current complementary to temperature (ICTAT), a poly resistor R3 236, an amplifier 238, a PMOS transistor 240, and a poly resistor R4 242. A first terminal of R3 236 is coupled to node 235, and a second terminal of R3 236 is coupled to VSS. An inverting input of amplifier 238 is coupled to node 235, and a non-inverting input of amplifier 238 is coupled to a circuit node 241. An output of amplifier 238 provides VCI and is coupled to a control electrode of transistor 240. A first current electrode of transistor 240 is coupled to VDD and a second current electrode of transistor 240 is coupled to node 241. A first terminal of R4 242 is coupled to node 241, and a second terminal of R4 242 is coupled to VSS.

Sense amplifier circuit 108 includes transistor 210 and 212, as well as R21 222 and SA1 214. Sense amplifier circuit 108 includes a reference path 211 and a cell path 213. Reference path 211 includes current load device 210, switches 216 and 220 and NMOS transistor 218, and R21 222. In one embodiment, the resistance of R21 222 is set to a resistance which is about half way between the resistance of the HRS and LRS of an MTJ of MRAM array 102. (Note that each R2 resistor, such as resistor R21 222, can be implemented as a variable resistor in which the resistance of each R2 in sense amplifier circuit 108 can be trimmed, as known in the art, to address local variation.) The second current electrode of transistor 210 is coupled to a reference comparison node 215 at the non-inverting input of SA1 214. A closed switch 216 is coupled between node 215 and a first current electrode of transistor 218. A closed switch 220 is coupled between a second current electrode of transistor 218 and a circuit node 221. Circuit node 221 is coupled to the first terminal of R21 222. Transistor 218 corresponds to the pass transistor which is turned on when the selected word line, WLj in this example, is activated by row decode 104. Note that pass transistor 218 represents a reference bit cell which does not include a memory element. Closed switches 216 and 220 represent circuitry within column decode 106 which connects the reference bit cell (i.e. pass transistor 218) and R21 222 to reference comparison node 215 at the input of sense amplifier circuity 108.

Cell path 213 includes current load device 212 as well as switches 224 and 230, NMOS transistor 226, as well as selected bit cell 228 of array 202. The second current electrode of transistor 212 is coupled to a cell comparison node 223 at the inverting input of SA1 214. A closed switch 224 is coupled between node 223 and a first current electrode of transistor 226. A second current electrode of transistor 226 is coupled to a first terminal of selected memory element 228 ($MTJ_{j,1}$, which corresponds to the memory element at the intersection of row j and column 1, in which column 1 refers to the selected bit line of $BL_{1,1}$-$BL_{1,K}$). A closed switch 230 is coupled between a second terminal of the selected bit cell 228 and VSS. As with transistor 218, transistor 226 corresponds to the pass transistor which is turned on when the selected word line, WLj in this example, is activated by row decode 104. Closed switches 224 and 230 represent circuitry within column decode 106 which connects the selected bit cell to DL1 (and thus to cell comparison node 223) at the input of sense amplifier circuity 108.

In operation, current load device 210 is controlled by VCV to ensure a constant voltage drop over R21 (i.e. a constant voltage at node 221), regardless of process and temperature variations of R21. Therefore, VCV refers to a "Voltage Controlled Voltage" in which the voltage at the control electrode of transistor 210 controls the voltage over R21. Current load device 212 is controlled by VCI to ensure a constant current through the selected MTJ (i.e. selected bit cell 228) being read, regardless of the value of the resistance of the MTJ. Therefore, VCI refers to a "Voltage Controlled Current" in which the voltage at the control electrode of transistor 212 controls the current through the selected MTJ. Note that resistors R1, R21-R2N, R3, and R4 are all poly type resistors which vary with both process and temperature. However, since they are all the same poly type as each other, all the resistors will track each other globally with respect to process and temperature.

To generate the VCV global bias voltage, bias generator 114 uses VBGREF which is a bandgap voltage that is constant across temperature and voltage (and may be fixed to a particular value based on the design of bandgap voltage generator 202). Note that any bandgap voltage generator may be used to generate VBGREF. The configuration of amplifier 204 and transistor 206 operate to convert VBGREF to a current through R1 208, at node 209. This current is represented by "VBGREF/R1". Note that this current is dependent on the resistance of poly resistor R1 208. Amplifier 204, based on VBGREF and the voltage at node 209, controls bias voltage VCV, and transistors 206 and 210 operate as a current mirror, such that a current proportional to VBGREG/R1 is provided through R21. This results in a voltage of "(VBGREF·R21)/R1" at node 221. This voltage over R21 remains constant over process and temperature variations (e.g., this voltage is relatively insensitive to a temperature coefficient of R21). That is, due to the presence of R21/R1 as a factor in the voltage at node 221, the variations in poly resistors R21 and R1 due to process and temperature cancel each other out, thus negating their effects on reference comparison node 215. Similarly, as described in reference to bias generator 112 below, the variations in poly resistors R3 and R4 due to process and temperature cancel each other out, thus negating their effects on cell comparison node 223.

Referring to bias generator 112, an IPTAT current source 232 coupled between VDD and node 235 and an ICTAT current source 234 coupled between VDD and node 235 together produce a constant current, Iconstant through node 235 and resistor R3 236. That is, an IPTAT current added with an ICTAT current provides a current that is constant over temperature variations. At node 235, at the inverting input of amplifier 238, a current to voltage conversion circuit (implemented by R3) converts Iconstant to a voltage at node 235 which is based on Iconstant and R3. Amplifier 238, based on the voltages at node 235 and node 211, controls bias voltage VCI and results in an absolute and constant current, with respect to temperature, through R4 242, represented as "(Iconstant·R3)/R4". Note that, due to the presence of R3/R4 as a factor in the current at node 211, the variations in poly resistors R3 and R4 due to process and temperature cancel each other out, thus negating their effects on cell comparison node 223. Since transistor 240 and 212 operate as a current mirror, transistor 212 provides a current proportional to "(Iconstant·R3)/R4" through selected bit cell 228. Therefore, the bias voltage VCI results in a current through the MTJ of bit cell 228 that remains constant over temperature, regardless of the programmed resistance value of the MTJ. SA1 214, implemented as a comparator, then compares the voltage at reference comparison node 215 with the voltage at cell comparison node 223 to determine the logical state of DO1, at the output of SA1 214, while being minimally affected by the process and temperature variations in poly resistor R21.

That is, with each current load device 210 and 212 receiving a different and separate bias voltage, improved mitigation of variations in process and temperature can be achieved. For example, with VCV being based on a ratio between R21 and R1, the effects of R21 and R1 cancel each other out, and with VCI being based on a ratio between R4 and R3, the effects of R4 and R3 cancel each other out. In this manner, improved sensing of nodes 215 and 223 can be achieved by the corresponding sense amplifier, such as SA1 214 in the illustrated example.

Figure 3:
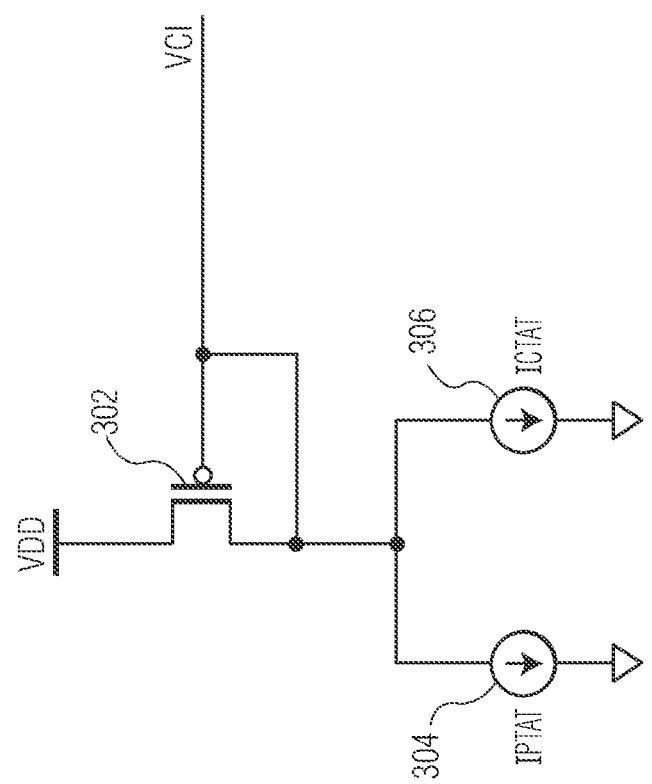
FIG. 3 illustrates, in partial block diagram and partial schematic form, a portion of the MRAM of FIG. 1, in accordance with one embodiment of the present invention.

FIG. 3 illustrates an alternate embodiment for generating VCI. As illustrated in FIG. 3, instead of bias generator 112, a PMOS transistor 302 and an IPTAT current generator 304 and an ICTAT current generator 306 may be used, without including poly resistors R3 and R4 at all. In this embodiment, a first current electrode of transistor 302 is coupled to VDD, and a control electrode provides VCI. The control electrode of transistor 302 is also connected to a second current electrode of transistor 302 which is connected to a first terminal of each of current sources 304 and 306. In this manner, a constant current over temperature is provided through the second current electrode of transistor 302, resulting in bias voltage VCI. This constant current would be mirrored by transistor 212 in FIG. 2 to also produce a constant current over temperature through selected bit cell 228, regardless of the programmed resistance of the MTJ. However, this embodiment may not be as desirable as the embodiment of bias generator 112 illustrated in FIG. 2 due to a lack in drive strength for VCI to be a global signal, i.e. a signal provided to multiple sense amplifiers, as illustrated in FIG. 1.

Therefore, by now it can be appreciated how multiple poly resistors (e.g. R1, R21-R2N, R3, and R4) of the same type and resistive material, can be used to generate separate bias voltages for a current load device driving a reference path and a current load device driving a cell path to produce voltages which can be accurately sensed by a corresponding sense amplifier. In one embodiment, during a read operation of a selected bit cell of an MRAM array, the first bias voltage for controlling current in the reference path is VCV which is dependent upon VBGREF/R1 while the second bias voltage for controlling current in the cell path is VCI which is dependent upon Iconstant. These bias voltages, VCV and VCI, can be used as global bias voltages within sense amplifier circuitry in which these bias voltages are used to control the current in the reference path and cell path, respectively, of each sense amplifier circuit of a plurality of sense amplifier circuits for the MRAM array.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different architectures in a variety of different information processing systems. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, memory system 100 can include other resistive memories other than MRAM. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a circuit includes a sense amplifier circuit, a first circuit, and a second circuit. The sense amplifier circuit includes a reference path including a first current load device and a reference comparison node, the reference path is coupled to a cell reference circuit during a voltage read by the sense amplifier circuit, wherein the first current load device includes a control input for controlling a current of the reference path. The sense amplifier circuit includes a cell path including a second current load device and a cell comparison node, the cell path is coupled to a memory cell of an array of memory cells during a voltage read by the sense amplifier circuit, wherein the second current load device includes a control input for controlling a current of the cell path. The sense amplifier circuit also includes a comparator circuit including a first input coupled to the reference comparison node, a second input coupled to the cell comparison node, and an output a to provide a data out signal based on a comparison of voltages of the reference comparison node and the cell comparison node and indicative of a data value being stored in a memory cell being read during a memory read operation. The first circuit includes an output to provide a first signal to the control input of the first current load device, and the second circuit includes an output to provide a second signal to the control input of the second current load device, the first signal and the second signal being different signals. In one aspect of the above embodiment, the second signal is a voltage to generate a relatively constant current through the cell path regardless of a resistance value of the memory cell being read, wherein the memory cell is a resistive memory cell. In another aspect, the second circuit includes a voltage to current converter that includes an input generated from a node receiving a current that is relatively constant across temperature. In another aspect, a voltage of the second signal is dependent upon a current that is relatively constant across temperature, wherein a voltage of the first signal is not dependent upon the current that is relatively constant across temperature. In a further aspect, the second circuit includes a current mirror to mirror the current that is relatively constant across temperature through the cell path. In yet another aspect of the above embodiment, the first circuit includes voltage to current converter, wherein the voltage to current converter includes a first resistor of a first resistive material, wherein the cell reference circuit includes second resistor of the first resistive material. In a further aspect, a voltage across the second resistor is relatively insensitive to a temperature coefficient of the second resistor. In another aspect, the first circuit includes a voltage to current converter that includes an input receiving a voltage that is relatively constant across temperature, wherein the first signal is based on the voltage that is relatively constant across temperature, wherein the second signal is not based on the voltage that is relatively constant across temperature. In another aspect, the first signal is a voltage to generate a relatively constant voltage across the cell reference circuit accounting for temperature and process variation during a read operation of the sense amplifier circuit, wherein the cell reference circuit is characterized as a resistance reference circuit. In another aspect, the circuit further includes a second sense amplifier circuit. In this another aspect, the second sense amplifier circuit includes a second reference path including a third current load device and a second reference comparison node, the second reference path is coupled to a second cell reference circuit during a voltage read by the second sense amplifier circuit, wherein the third current load device includes a control input for controlling a current of the second reference path; a second cell path including a fourth current load device and a second cell comparison node, the second cell path is coupled to a memory cell of the array of memory cells during a voltage read by the second sense amplifier circuit, wherein the fourth current load device includes a control input for controlling a current of the second cell path; and a second comparator circuit including a first input coupled to the second reference comparison node, a second input coupled to the second cell comparison node, and an output a to provide a second data out signal based on a comparison of voltages of the second reference comparison node and the second cell comparison node and indicative of a data value being stored in a memory cell being read during a memory read operation by the second sense amplifier circuit, wherein the first signal is provided to the control input of the third current load device and the second signal is provided to the control input of the fourth current load device. In another aspect of the above embodiment, wherein the memory cell is characterized as a resistive memory cell. In a further aspect, the memory cell is characterized as an MRAM memory cell. In yet another aspect of the above embodiment, the cell reference circuit is characterized as a resistor element.

In another embodiment, a method of performing memory read operation with a sense amplifier circuit includes generating a first signal to control a current of a reference path of a sense amplifier circuit during a memory read operation of a memory cell of an array of memory cells, the reference path including a reference comparison node; generating a second signal to control a current of a cell path of the sense amplifier circuit during the memory read operation, the cell path including a cell comparison node, wherein the first signal and the second signal are different signals; and comparing a voltage of the reference comparison node when a cell reference circuit is coupled to the reference path and a voltage of the cell comparison node when the memory cell of a memory array is coupled to the cell path to generate an indication of a value stored in the memory cell during the memory read operation. In one aspect of this another embodiment, the generating the first signal is based on a voltage that is relatively constant across temperature, wherein the generating the second signal is not based on the voltage that is relatively constant across temperature. In another aspect, the generating the second signal is based on a current that is relatively constant across temperature, wherein the generating the first signal is not based on the current that is relatively constant across temperature. In another aspect, the method further includes controlling a current of a second reference path of a second sense amplifier circuit with the first signal during a memory read operation of a second memory cell of the array of memory cells, the second reference path including a second reference comparison node; controlling a current of a second cell path of the second sense amplifier circuit during the memory read operation of the second memory cell, the second cell path including a second cell comparison node; and comparing a voltage of the second reference comparison node when a second cell reference circuit is coupled to the second reference path and a voltage of the second cell comparison node when the second memory cell of the memory array is coupled to the second cell path to generate an indication of a value stored in the second memory cell during the memory read operation.

In yet another embodiment, a circuit includes a plurality of sense amplifier circuits, each sense amplifier circuit of the plurality including: a reference path including a first current load device and a reference comparison node, the reference path is coupled to a cell reference circuit during a voltage read by the sense amplifier circuit, wherein the first current load device includes a control input for controlling a current of the reference path; a cell path including a second current load device and a cell comparison node, the cell path is coupled to a memory cell of an array of memory cells during a voltage read by the sense amplifier circuit, wherein the second current load device includes a control input for controlling a current of the cell path; and a comparator circuit including a first input coupled to the reference comparison node, a second input coupled to the cell comparison node, and an output a to provide a data out signal based on a comparison of voltages of the reference comparison node and the cell comparison node and indicative of a data value being stored in a memory cell being read during a memory read operation. In this yet another embodiment, the circuit also includes a first circuit including an output to provide a first signal to the control input of the first current load device of each sense amplifier circuit of the first plurality of sense amplifier circuits; and a second circuit including an output to provide a second signal to the control input of the second current load device of each sense amplifier circuit of the plurality of sense amplifier circuits, the first signal and the second signal being different signals. In one aspect of this yet another embodiment, a voltage of the second signal is dependent upon a current that is relatively constant across temperature, wherein a voltage of the first signal is not dependent upon the current that is relatively constant across temperature. In another aspect, the cell reference circuit includes a resistor wherein a voltage across the resistor is relatively insensitive to a temperature coefficient of the resistor.

What is claimed is:
1. A circuit comprising:
 a sense amplifier circuit including:
  a reference path including a first current load device and a reference comparison node, the reference path is coupled to a cell reference circuit during a voltage read by the sense amplifier circuit, wherein the first current load device includes a control input for controlling a current of the reference path;
  a cell path including a second current load device and a cell comparison node, the cell path is coupled to a memory cell of an array of memory cells during a voltage read by the sense amplifier circuit, wherein the second current load device includes a control input for controlling a current of the cell path;
  a comparator circuit including a first input coupled to the reference comparison node, a second input coupled to the cell comparison node, and an output a to provide a data out signal based on a comparison of voltages of the reference comparison node and the cell comparison node and indicative of a data value being stored in a memory cell being read during a memory read operation;

a first circuit including an output to provide a first signal to the control input of the first current load device;

a second circuit including an output to provide a second signal to the control input of the second current load device, the first signal and the second signal being different signals.

2. The circuit of claim 1 wherein the second signal is a voltage to generate a relatively constant current through the cell path regardless of a resistance value of the memory cell being read, wherein the memory cell is a resistive memory cell.

3. The circuit of claim 1 wherein the second circuit includes a voltage to current converter that includes an input generated from a node receiving a current that is relatively constant across temperature.

4. The circuit of claim 1 wherein a voltage of the second signal is dependent upon a current that is relatively constant across temperature, wherein a voltage of the first signal is not dependent upon the current that is relatively constant across temperature.

5. The circuit of claim 4 wherein the second circuit includes a current mirror to mirror the current that is relatively constant across temperature through the cell path.

6. The circuit of claim 1 wherein the first circuit includes voltage to current converter, wherein the voltage to current converter includes a first resistor of a first resistive material, wherein the cell reference circuit includes second resistor of the first resistive material.

7. The circuit of claim 6 wherein a voltage across the second resistor is relatively insensitive to a temperature coefficient of the second resistor.

8. The circuit of claim 1 wherein the first circuit includes a voltage to current converter that includes an input receiving a voltage that is relatively constant across temperature, wherein the first signal is based on the voltage that is relatively constant across temperature, wherein the second signal is not based on the voltage that is relatively constant across temperature.

9. The circuit of claim 1 wherein the first signal is a voltage to generate a relatively constant voltage across the cell reference circuit accounting for temperature and process variation during a read operation of the sense amplifier circuit, wherein the cell reference circuit is characterized as a resistance reference circuit.

10. The circuit of claim 1 further comprising:
a second sense amplifier circuit including:
a second reference path including a third current load device and a second reference comparison node, the second reference path is coupled to a second cell reference circuit during a voltage read by the second sense amplifier circuit, wherein the third current load device includes a control input for controlling a current of the second reference path;
a second cell path including a fourth current load device and a second cell comparison node, the second cell path is coupled to a memory cell of the array of memory cells during a voltage read by the second sense amplifier circuit, wherein the fourth current load device includes a control input for controlling a current of the second cell path;
a second comparator circuit including a first input coupled to the second reference comparison node, a second input coupled to the second cell comparison node, and an output a to provide a second data out signal based on a comparison of voltages of the second reference comparison node and the second cell comparison node and indicative of a data value being stored in a memory cell being read during a memory read operation by the second sense amplifier circuit;
wherein the first signal is provided to the control input of the third current load device and the second signal is provided to the control input of the fourth current load device.

11. The circuit of claim 1 wherein the memory cell is characterized as a resistive memory cell.

12. The circuit of claim 11 wherein the memory cell is characterized as an MRAM memory cell.

13. The circuit of claim 1 wherein the cell reference circuit is characterized as a resistor element.

14. A method of performing memory read operation with a sense amplifier circuit, the method comprising:
generating a first signal to control a current of a reference path of a sense amplifier circuit during a memory read operation of a memory cell of an array of memory cells, the reference path including a reference comparison node;
generating a second signal to control a current of a cell path of the sense amplifier circuit during the memory read operation, the cell path including a cell comparison node, wherein the first signal and the second signal are different signals;
comparing a voltage of the reference comparison node when a cell reference circuit is coupled to the reference path and a voltage of the cell comparison node when the memory cell of a memory array is coupled to the cell path to generate an indication of a value stored in the memory cell during the memory read operation.

15. The method of claim 14 wherein the generating the first signal is based on a voltage that is relatively constant across temperature, wherein the generating the second signal is not based on the voltage that is relatively constant across temperature.

16. The method of claim 14 wherein the generating the second signal is based on a current that is relatively constant across temperature, wherein the generating the first signal is not based on the current that is relatively constant across temperature.

17. The method of claim 14 further comprising:
controlling a current of a second reference path of a second sense amplifier circuit with the first signal during a memory read operation of a second memory cell of the array of memory cells, the second reference path including a second reference comparison node;
controlling a current of a second cell path of the second sense amplifier circuit during the memory read operation of the second memory cell, the second cell path including a second cell comparison node;
comparing a voltage of the second reference comparison node when a second cell reference circuit is coupled to the second reference path and a voltage of the second cell comparison node when the second memory cell of the memory array is coupled to the second cell path to generate an indication of a value stored in the second memory cell during the memory read operation.

18. A circuit comprising:
a plurality of sense amplifier circuits, each sense amplifier circuit of the plurality including:
a reference path including a first current load device and a reference comparison node, the reference path is coupled to a cell reference circuit during a voltage read by the sense amplifier circuit, wherein the first current load device includes a control input for controlling a current of the reference path;

a cell path including a second current load device and a cell comparison node, the cell path is coupled to a memory cell of an array of memory cells during a voltage read by the sense amplifier circuit, wherein the second current load device includes a control input for controlling a current of the cell path;

a comparator circuit including a first input coupled to the reference comparison node, a second input coupled to the cell comparison node, and an output a to provide a data out signal based on a comparison of voltages of the reference comparison node and the cell comparison node and indicative of a data value being stored in a memory cell being read during a memory read operation;

a first circuit including an output to provide a first signal to the control input of the first current load device of each sense amplifier circuit of the first plurality of sense amplifier circuits;

a second circuit including an output to provide a second signal to the control input of the second current load device of each sense amplifier circuit of the plurality of sense amplifier circuits, the first signal and the second signal being different signals.

19. The circuit of claim 18 wherein a voltage of the second signal is dependent upon a current that is relatively constant across temperature, wherein a voltage of the first signal is not dependent upon the current that is relatively constant across temperature.

20. The circuit of claim 18 wherein the cell reference circuit includes a resistor wherein a voltage across the resistor is relatively insensitive to a temperature coefficient of the resistor.

* * * * *